United States Patent
Miura

(10) Patent No.: US 9,153,762 B2
(45) Date of Patent: Oct. 6, 2015

(54) ELECTRONIC COMPONENT PACKAGE STRUCTURE

(71) Applicant: Murata Manufacturing Co., Ltd., Nagaokakyo-shi, Kyoto-fu (JP)

(72) Inventor: Tadamasa Miura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 195 days.

(21) Appl. No.: 13/966,514

(22) Filed: Aug. 14, 2013

(65) Prior Publication Data

US 2013/0328154 A1 Dec. 12, 2013

Related U.S. Application Data

(63) Continuation of application No. PCT/JP2012/052837, filed on Feb. 8, 2012.

(30) Foreign Application Priority Data

Feb. 24, 2011 (JP) ................. 2011-038765

(51) Int. Cl.
*H01L 31/058* (2006.01)
*H01L 35/02* (2006.01)
*H01C 7/00* (2006.01)
*H01L 35/34* (2006.01)
*H01C 1/012* (2006.01)
*H01C 17/065* (2006.01)
*H01C 7/04* (2006.01)
(Continued)

(52) U.S. Cl.
CPC ............. *H01L 35/02* (2013.01); *H01C 1/012* (2013.01); *H01C 7/008* (2013.01); *H01C 7/042* (2013.01); *H01C 17/06533* (2013.01); *H01L 35/34* (2013.01); *H01C 1/142* (2013.01); *H01C 1/1413* (2013.01); *H01C 7/04* (2013.01)

(58) Field of Classification Search
CPC ........ H01L 35/02; H01L 35/34; H01C 7/008; H01C 7/04
See application file for complete search history.

(56) References Cited

U.S. PATENT DOCUMENTS 4,870,225 A * 9/1989 Anao et al. .................. 174/261
6,975,502 B2 * 12/2005 Murosawa et al. ........ 361/321.2
(Continued)

FOREIGN PATENT DOCUMENTS

JP 61-245502 A 10/1986
JP 63-10502 U 1/1988
(Continued)

OTHER PUBLICATIONS

Official Communication issued in International Patent Application No. PCT/JP2012/052837, mailed on May 29, 2012.

*Primary Examiner* — Zandra Smith
*Assistant Examiner* — John M Parker
(74) *Attorney, Agent, or Firm* — Keating & Bennett, LLP

(57) ABSTRACT

A thermistor includes a metal substrate, a semiconductor ceramic layer on the metal substrate, and a pair of split electrodes on the semiconductor layer. The semiconductor ceramic layer is formed by a solid-phase method. The metal substrate includes ceramic particles and is not interrupted in the direction of thickness by the ceramic particles or a pillar defined by a chain of the ceramic particles. Preferably, the metal substrate and the ceramic layer of the thermistor have a thickness of about 10 μm to about 80 μm and about 1 μm to about 10 μm, respectively.

20 Claims, 3 Drawing Sheets

(51) Int. Cl.
   *H01C 1/14* (2006.01)
   *H01C 1/142* (2006.01)

(56) References Cited

U.S. PATENT DOCUMENTS

2003/0170432 A1* 9/2003 Kobayashi et al. ............ 428/209
2005/0120528 A1  6/2005 Okuda et al.
2007/0001297 A1* 1/2007 Higasa et al. .................. 257/723
2007/0229210 A1* 10/2007 Higuchi et al. ........... 338/22 SD
2009/0067117 A1  3/2009 Kasuya et al.
2013/0328153 A1* 12/2013 Miura .......................... 257/467

FOREIGN PATENT DOCUMENTS

| JP | 06-302406 A | 10/1994 |
| JP | 08-78267 A | 3/1996 |
| JP | 2003-007510 A | 1/2003 |
| JP | 2005-174974 A | 6/2005 |
| JP | 2009-032837 A | 2/2009 |

* cited by examiner

ELECTRONIC COMPONENT PACKAGE STRUCTURE

BACKGROUND OF THE INVENTION

1. Field of the Invention

The present invention relates to thermistors and methods for manufacturing thermistors, in particular, a thermistor based on a stack of a metal substrate, a thin-film thermistor layer, and electrodes, and a method for producing this type of thermistor.

2. Description of the Related Art

The known NTC thermistors or PTC thermistors for use as temperature sensors or other elements in protection circuits include the one disclosed in Japanese Unexamined Patent Application Publication No. 61-245502. The thermistor described in Japanese Unexamined Patent Application Publication No. 61-245502 has a flat-plate metal substrate that also serves as an electrode, a temperature-sensitive resistor film formed on either main surface of the substrate, and an electrode film formed on the temperature-sensitive resistor film.

In the structure of this thermistor, however, one of the electrodes is the flat-plate metal substrate and the other is the uppermost electrode film. Mounting this thermistor on a substrate or the like requires the electric connection to the electrode film to be established by wire bonding. Thus, it is impossible to mount this thermistor into an extremely small space. For example, when a thermistor of this type is used as a temperature sensor for an IC component packaged on a printed wiring board, there is a very narrow gap of 150 μm to 200 μm between the printed wiring board and the IC package and it is preferred to mount the thermistor into this gap. However, it is very difficult to mount an electronic component into such a very small gap by wire bonding.

According to Japanese Unexamined Patent Application Publication No. 61-245502, furthermore, the temperature-sensitive resistor film is formed on the wiring board by sputtering. Although the resistor film formed by sputtering is in good contact with the flat-plate metal substrate, sputtering is not suitable for mass production because performing sputtering requires costly production equipment. Solid-phase formation is desired; however, the use of this method results in the rate of shrinkage of the flat-plate metal substrate being different from that of the temperature-sensitive resistor film because of the different thermal expansion coefficients of the two elements. Even if the flat-plate metal substrate and the temperature-sensitive resistor film can be bonded together, therefore, the bonding strength of the interface may be insufficient, depending on the external environment.

SUMMARY OF THE INVENTION

Accordingly, preferred embodiments of the present invention provide a thermistor that can be mounted by soldering and offers excellent bonding strength even when formed by a solid-phase method, and also provide a method for producing such a thermistor.

A first aspect of a preferred embodiment of the present invention includes a thermistor that includes a metal substrate, a semiconductor ceramic layer on the metal substrate, and a pair of split electrodes on the semiconductor layer. The semiconductor ceramic layer is preferably formed by a solid-phase method, for example. The metal substrate contains ceramic particles. However, the thickness of the substrate is not interrupted by the ceramic particles or a pillar defined by a chain of the ceramic particles.

The inventor proposed a thermistor including a metal substrate, a semiconductor ceramic layer on the metal substrate, and a pair of split electrodes on the semiconductor ceramic layer in a previous PCT application (PCT/JP2010/64089). Such a structure allows the thermistor to be mounted on a printed wiring board by soldering processes such as reflow soldering. The semiconductor ceramic layer and the metal substrate are obtained by firing intermediate thin films together.

Even in this configuration, however, solid-phase formation results in the rate of shrinkage of the metal substrate being different from that of the semiconductor ceramic layer because of the different thermal expansion coefficients of the two elements, even when the intermediates for the two elements are fired together. Even if the metal substrate and the semiconductor ceramic layer can be bonded together, therefore, the value of resistance greatly varies depending on the environment. For example, exposure to a high-temperature and a high-humidity environment causes moisture to penetrate into the bonding interface, breaking the bond between the metal substrate and the semiconductor ceramic layer. In developing preferred embodiments of the present invention, it has been discovered that mixing a ceramic powder in the metal substrate improves the strength of the bonding between the semiconductor ceramic layer and the metal substrate. This is probably because the anchor effect of the ceramic powder and an increase in the area of the contact between the semiconductor ceramic layer and the metal substrate make some contributions. Furthermore, the metal substrate is not interrupted in the direction of thickness by the ceramic particles or a pillar defined by a chain of the ceramic particles. This improves the strength of the bonding between the metal substrate and the semiconductor ceramic layer without affecting flexibility or the strength of the metal substrate.

The expression the metal substrate is interrupted in the direction of thickness by the ceramic particles or a pillar defined by a chain of the ceramic particles means that a single ceramic particles or a pillar of ceramic particles is exposed on both the front and the back of the metal substrate.

Preferably, the metal substrate and the ceramic layer of the thermistor have a thickness of about 10 μm to about 80 μm and about 1 μm to about 10 μm, respectively, for example.

A low-profile thermistor having such a structure can be mounted into an extremely narrow space as small as about 200 μm or less, for example, and also preferably has flexibility because the semiconductor ceramic layer and the metal substrate are obtained preferably by firing intermediate thin films together, for example. As a result, the ceramic layer is unlikely to crack even when the electronic component is exposed to stress, and the electronic component can be mounted even on a bumpy, stepped, or similarly uneven space.

It is also preferred that each of the metal substrate and the ceramic layer is in the form of a sheet.

Furthermore, it is preferred that the sheet-shaped metal substrate and the sheet-shaped ceramic layer are obtained by stacking intermediates thereof and firing the intermediates together.

A thermistor according to an aspect of a preferred embodiment of the present invention is preferably produced by this method. Such a configuration ensures that the thermistor is flexible and unlikely to develop cracks or other defects in the ceramic layer.

It is also preferred that the ceramic particles constitute about 16 vol % to about 40 vol %, both inclusive, of the metal substrate, for example.

The use of such a configuration helps to ensure that the thickness of the metal substrate is not interrupted by the ceramic particles in the metal substrate or a pillar defined by a chain of the ceramic particles. It therefore becomes easier to improve the strength of the bonding between the metal substrate and the semiconductor ceramic layer without affecting the flexibility of the entire thermistor.

It is also preferred that the semiconductor ceramic layer is made of an NTC ceramic material and the ceramic particles are made of the same material as the semiconductor ceramic layer or an iron oxide.

The use of such materials allows the strength of the bonding between the metal substrate and the semiconductor ceramic layer to be improved without any adverse effects on the characteristics of the semiconductor ceramic layer or reduced flexibility.

It is also preferred that the split electrodes contain ceramic particles.

Such a configuration is highly advantageous in that the strength of the bonding between the semiconductor ceramic layer and the split electrodes is also improved.

According to another preferred embodiment of the present invention, a method for producing a thermistor including a metal substrate, a semiconductor ceramic layer on the metal substrate, and a pair of split electrodes on the semiconductor ceramic layer, includes applying a predetermined thickness of a ceramic slurry to a carrier film to form a ceramic green sheet as an intermediate for the semiconductor ceramic layer, applying a predetermined thickness of a metal paste containing a ceramic powder to the ceramic green sheet to form a metal sheet as an intermediate for the metal substrate, applying a predetermined thickness of an electrode-forming paste to the surface of the ceramic green sheet opposite to the metal sheet to form a pattern of electrodes as an intermediate for the split electrodes, and firing the metal sheet, the ceramic green sheet, and the pattern of electrodes together.

In such a production method, firing the metal sheet and the ceramic green sheet together allows the ceramic powder to provide ceramic particles into the interface between the metal substrate and the semiconductor ceramic layer, and the ceramic particles produce unevenness on the surface of the metal substrate. As a result, an anchor effect or an increase in the area of contact improves the strength of bonding.

In this production method, preferably, the ceramic powder constitutes about 16 vol % to about 40 vol %, both inclusive, of the metal sheet, for example.

Such a production method provides a thermistor with improved strength of the bonding between the metal substrate and the semiconductor ceramic layer without affecting the flexibility of the entire thermistor.

In this production method it is also preferred that the electrode paste also contains a ceramic powder.

Such a production method additionally provides a thermistor with improved strength of the bonding between the semiconductor ceramic layer and the split electrodes.

Preferred embodiments of the present invention provide thermistors that can be mounted by soldering and offer excellent bonding strength even when formed by a solid-phase method and methods for producing such thermistors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment 1

Figure 1:
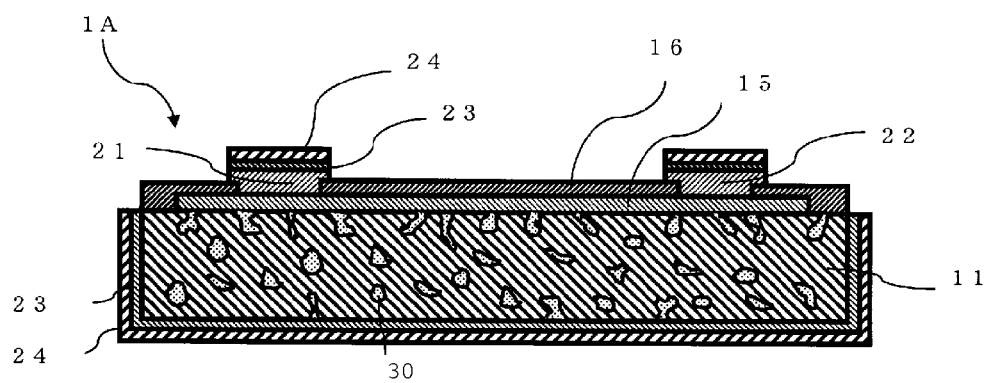
FIG. 1 is a cross-sectional view of a flexible thermistor according to Preferred Embodiment 1 of the present invention.

FIG. 1 is a cross-sectional view of a flexible thermistor according to Preferred Embodiment 1 of the present invention.

According to this preferred embodiment of the present invention, a flexible thermistor 1A includes a metal substrate 11, a semiconductor ceramic layer 15 on the metal substrate 11, and a pair of split electrodes 21 and 22 on the semiconductor ceramic layer 15. The surface of the split electrodes 21 and 22 is coated with a Ni coating 23 and a Sn coating 24 in this order. The surface of the metal substrate 11 is also coated with a Ni coating 23' and a Sn coating 24'. Although in this preferred embodiment the surface of the semiconductor ceramic layer 15 is preferably coated with a protection layer 16, this protection layer is not essential.

The metal substrate 11 is obtained by firing a sheet formed from a paste containing a metal powder, the semiconductor ceramic layer 15 is obtained by firing a sheet formed from a ceramic slurry or a ceramic paste, and the split electrodes 21 and 22 are obtained by firing a paste containing the material for making the electrodes. The three intermediates, i.e., the sheet of the metal-powder-containing paste, the sheet of the ceramic slurry, and the electrode-forming paste, are fired together. Note that preferably at least the metal substrate 11 and the semiconductor ceramic layer 15 are obtained by firing the intermediates thereof together.

The thickness of the metal substrate 11 is preferably about 10 μm to about 80 μm, that of the semiconductor ceramic layer 15 preferably is of about 1 μm to about 10 μm, and that of the split electrodes 21 and 22 preferably is about 0.1 μm to about 10 μm, for example. The thickness of the entire flexible thermistor 1A preferably is about 10 μm to about 100 μm, for example.

The semiconductor ceramic layer 15 can preferably be made of an NTC ceramic material containing a combination of transition metals such as Mn, Ni, Fe, Ti, Co, Al, and/or Zn in appropriate amounts, for example. Although in this preferred embodiment oxides of such transition metals are preferably mixed, such chemical elements may also be used as starting materials in other forms such as carbonates or hydroxides. The metal substrate 11 and the split electrodes 21 and 22 can be made of a noble metal such as Ag, Pd, Pt, or Au, a simple base metal such as Cu, Ni, Al, W, or Ti, or an alloy of such metals.

The metal substrate 11 contains ceramic particles 30, and the thickness of the metal substrate 11 is not interrupted by the ceramic particle 30 or a pillar defined by a chain of the ceramic particles. More specifically, the ceramic particles 30 preferably have a dimension of about 0.1 μm to about 3.0 μm, for example, and the ceramic particles 30, when fired in the metal paste as the intermediate for the metal substrate, do not form a pillar as a chain of the ceramic particles 30 or form only very small pillars that do not interrupt the metal substrate 11 in the direction of thickness.

Such a configuration provides the thermistor 1A with improved strength of the bonding between the metal substrate 11 and the semiconductor ceramic layer 15 without affecting the flexibility of the entire flexible thermistor 1A.

The amount of the ceramic particles 30 in the metal substrate 11 is preferably in the range of about 16 vol % to about vol %, both inclusive, for example. The use of ceramic particles in an amount less than about 16 vol % may cause the bonding strength to be insufficient under stress conditions, such as a high-temperature and a high-humidity environment, because the proportion of the ceramic particles 30 in the metal substrate is too small. The use of ceramic particles in an amount greater than about 40 vol % may cause the ceramic particles 30 to be easily connected and form pillars and the ceramic particles to easily extend in the direction of the thickness of the metal substrate 11, so as to affect the flexibility of the metal substrate 11.

The material used to make the ceramic particles 30 is preferably the same as or similar to that for the semiconductor ceramic layer 15. If the semiconductor ceramic layer 15 is made of a Mn—Ni—Fe—Ti NTC thermistor material, for example, the ceramic particles 30 are preferably made of the oxides of the individual metals, i.e., $Mn_3O_4$, NiO, $Fe_2O_3$, and $TiO_2$, a mixed oxide of these metals, or any other similar compound. Using the same material as that used to make the semiconductor ceramic layer 15 reduces the possibility of damage to the characteristic of the semiconductor ceramic layer 15. If the material for the semiconductor ceramic layer 15 is extremely prone to corrosion by plating chemicals, a plating-resistant iron oxide ($Fe_2O_3$) is more preferred than materials equivalent to that of which the semiconductor ceramic layer 15 is made. It is also possible to use the material used to make the protection layer 16.

Incidentally, the Ni coating 23' and the Sn coating 24' on the surface of the metal substrate 11 are not essential; these coatings are inevitably formed during the formation of the Ni coating 23 and the Sn coating 24 on the surface of the split electrodes 21 and 22 by electroplating because the metal substrate 11 is also made of metal.

Figure 2:
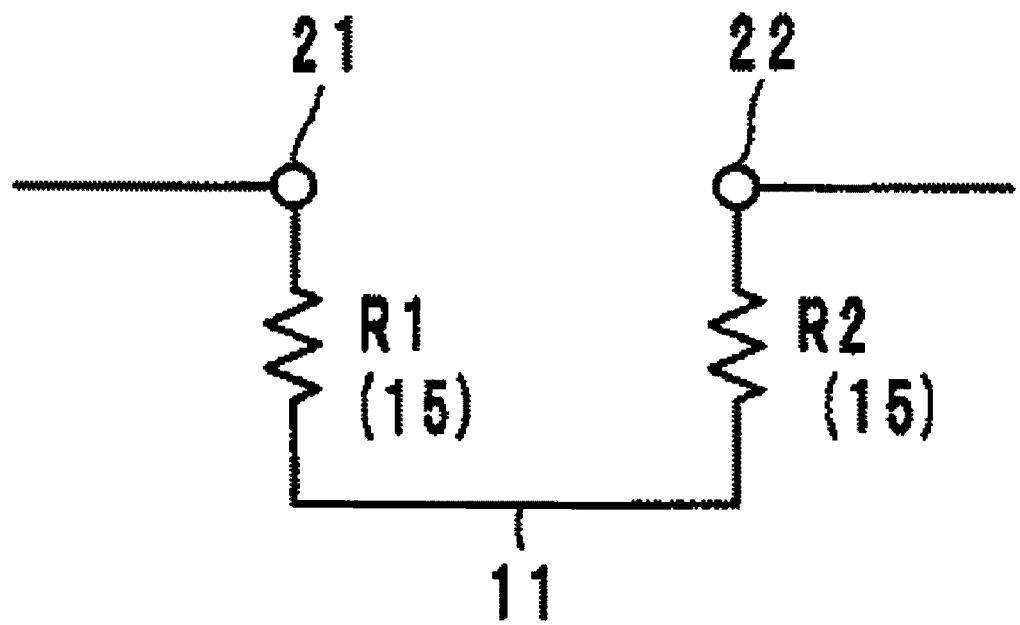
FIG. 2 illustrates a circuit equivalent to the flexible thermistor 1A according to Preferred Embodiment 1 of the present invention.

FIG. 2 illustrates a circuit equivalent to the flexible thermistor 1A. The split electrodes 21 and 22 serve as input and output terminals, and resistors R1 and R2 are defined by the semiconductor ceramic layer 15 and electrically connected in series by the metal substrate 11. In other words, a thermistor circuit includes the split electrodes 21 and 22, the metal substrate 11, and the resistor R1 and R2 provided by the semiconductor ceramic layer 15 sandwiched between the electrodes and the substrate in the direction of thickness.

Figure 3:
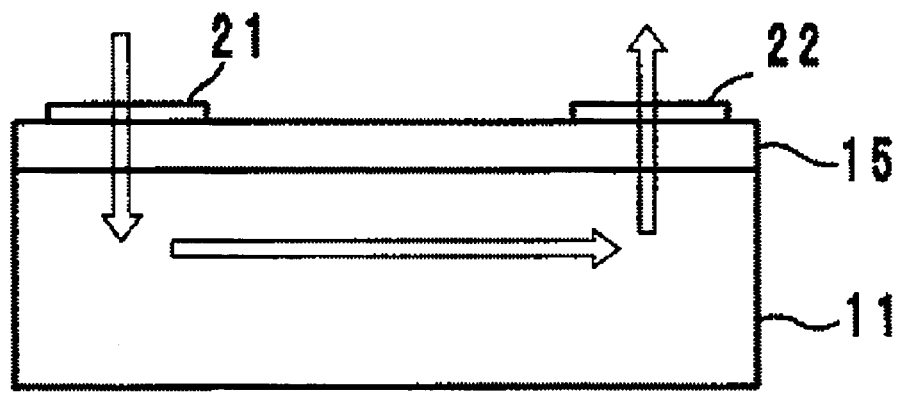
FIG. 3 illustrates the flow of current through the flexible thermistor 1A according to Preferred Embodiment 1 of the present invention.

FIG. 3 illustrates the flow of current through the flexible thermistor 1A. Since the split electrodes 21 and 22 are on the surface of the semiconductor ceramic layer 15, the current flows through the portions of the semiconductor ceramic layer 15 that are in contact with the split electrodes 21 and 22 and through the metal substrate 11 as indicated by an arrow in FIG. 3. The semiconductor ceramic layer 15 often develops cracks in the middle while the flexible thermistor 1A is bent or mounted using a chip mounter; however, the cracks occurring in the middle portion of the semiconductor ceramic layer 15 would not affect the electrical properties of the entire flexible thermistor 1A because that portion is not included in the current path.

The following describes a non-limiting example of a method for producing the flexible thermistor 1A.

First, a substrate-forming paste mainly composed of Ag—Pd and containing a ceramic powder as a source of ceramic particles is shaped using a doctor blade into a metal sheet, the intermediate for the metal substrate 11, in such a way that the thickness of the fired sheet will be in the range of about 5 µm to about 100 µm. The raw material for the semiconductor ceramic layer 15, i.e., a Mn—Ni—Fe—Ti oxide or similar compounds, is then weighed in accordance with a predetermined formula (with the resistivity target at about $10^4$ Ωcm) and fully wet-milled in a ball mill using crushing media such as zirconia. The milled material is then calcined at a predetermined temperature to produce a ceramic powder.

The ceramic powder is wet-mixed with an organic binder to produce a semiconductor ceramic paste. The obtained semiconductor ceramic paste is formed into the semiconductor ceramic layer 15 by screen printing or a similar process. An organic binder is then added to an insulating material such as $Fe_2O_3$ to make a paste. The paste is formed into the protection layer 16 by screen printing or a similar process, exposing only the portions to which the split electrodes 21 and 22 will later be connected. An Ag—Pd paste, the intermediate for the split electrodes 21 and 22, is then applied by screen printing in such a way that the electrodes are connected to the portions of the semiconductor ceramic layer 15 not covered by the protection layer 16. A laminate is obtained in this way.

The obtained large sheet-shaped laminate is cut into individual thermistor units. The thermistor units are placed in a zirconia sagger, treated to remove the binder, and fired at a predetermined temperature (e.g., about 900° C. to about 1300° C.)

The Ni coating 23 and the Sn coating 24 are then sequentially formed by electrolytic plating.

Although the semiconductor ceramic layer 15 and the protection layer 16 are typically formed preferably by screen printing, these layers may also be formed by gravure printing or an inkjet process or using a doctor blade, for example. The metal substrate 11 can also be produced by printing methods such as screen printing. The split electrodes 21 and 22 can be made by techniques such as screen printing, sputtering, or vapor deposition.

EXPERIMENT 1

Preferred embodiment 1, described with reference to FIG. 1, was tested in Experiment 1.

First, $Mn_3O_4$, NiO, $Fe_2O_3$, and $TiO_2$ were weighed such that the resistivity would be $10^4$ Ωcm and were fully wet-milled in a ball mill using crushing media such as zirconia. The milled material was calcined at 700° C. for 2 hours. A calcined ceramic powder containing a Mn—Ni—Fe—Ti oxide was obtained in this way.

The calcined powder was wet-milled, and an organic binder was added to the milled powder to produce a semiconductor ceramic paste.

An Ag—Pd paste containing 90 wt % Ag and 10 wt % Pd was mixed with the auxiliary material, or additive mentioned in Table 1, a ceramic powder prepared by a method similar to that for the aforementioned calcined ceramic powder, in accordance with the proportions given in Table 1. The obtained metal paste was shaped into a metal sheet on a PET carrier sheet using a doctor blade in such a way that the thickness of the fired sheet would be 30 µm.

On the obtained metal sheet the semiconductor ceramic paste was shaped into a sheet by screen printing to produce a semiconductor ceramic pattern that would have a thickness of 3 µm after being fired. On this pattern a sheet-shaped pattern for making a protection layer was formed from $Fe_2O_3$, a material highly resistant to plating chemicals. The areas were left exposed in which the split electrodes would later be formed and which were slightly smaller than the areas of the split electrodes, and the thickness was adjusted so that the fired pattern would have a thickness of 10 µm. Then patterns of split electrodes were formed using the same metal paste for making the metal substrate in such a way that the thickness of the fired patterns would be 3 µm. The obtained metal sheet, sheet-shaped semiconductor ceramic pattern, sheet-shaped protection-layer-making pattern, and patterns of split electrodes were degreased and then fired together at 950° C. for 2 hours. A thermistor was obtained in this way as a stack of a metal substrate, a semiconductor ceramic layer, a protection layer, and a split-electrode layer.

The obtained thermistor was plated sequentially with Ni and Sn by electrolytic plating; Ni and Sn coatings were formed on the surface of the split electrodes and the metal substrate. The thermistor was then soldered to lands on the surface of a glass-epoxy board using Sn—Ag—Cu lead-free solder.

After the measurement of the room-temperature resistance at 25° C., the thermistor was exposed to a high-temperature and high-humidity environment, 60° C. and 95%, for 300 hours. After the thermistor was allowed to cool to room temperature, 25° C., the room-temperature resistance was measured and the percent change in room-temperature resistance following the exposure to high temperature and high humidity was determined. The number of specimens was 1000, and Table 1 summarizes the percentage of specimens with a change in resistance of 10% or more.

TABLE 1

| No. | Amount of auxiliary material (vol %) | Percentage of devices with a change in resistance of ≥10% following a 300-hour exposure to 60° C. and 95 RH (%) |
| --- | --- | --- |
| 1 | 0 | 2.8 |
| 2 | 16 | 0.5 |
| 3 | 24 | 0 |
| 4 | 32 | 0 |
| 5 | 40 | 0 |
| 6 | 48 | 0 |

Table 1 shows that for sample 1, which contained no auxiliary ceramic powder, the percentage of specimens with a change in resistance of 10% or more was as high as 2.8%, while for samples 2 to 6 the percentage of such specimens was 0.5% or less, indicating the sufficient strength of the bonding interface between the metal substrate and the semiconductor ceramic layer which allowed the thermistors to withstand exposure to high temperature and high humidity.

EXPERIMENT 2

Figure 4:
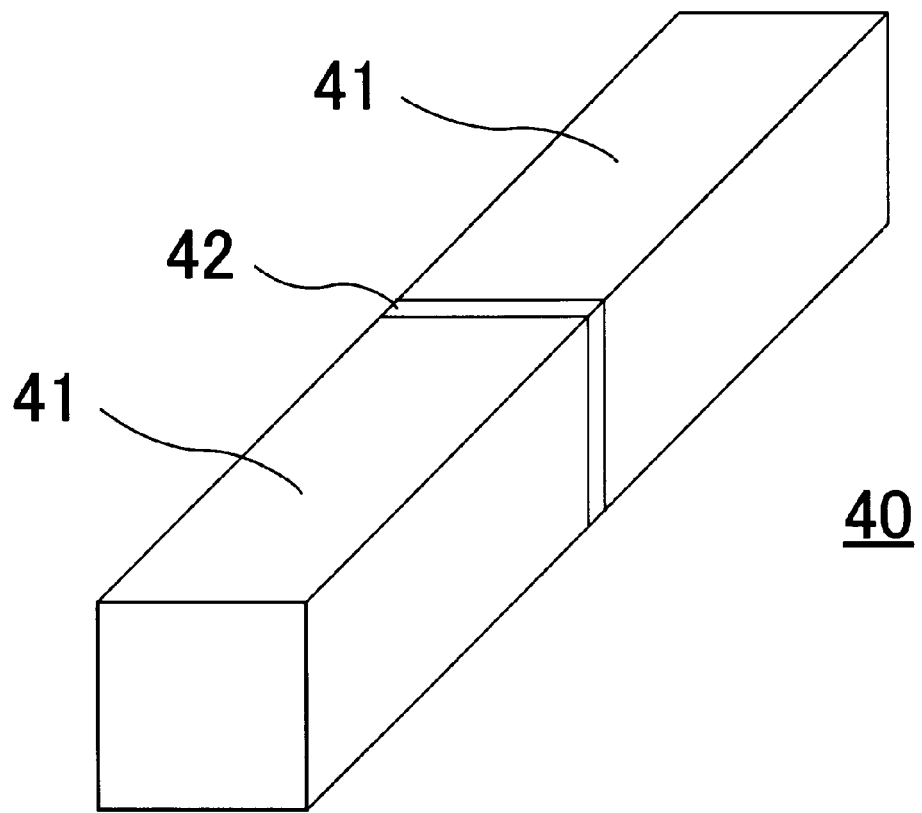
FIG. 4 illustrates a test piece for bonding strength measurement used in Experiment 2.

Test pieces 40 of the type illustrated in FIG. 4 were prepared as specimens for more quantitative measurement of the strength of the bonding between the semiconductor ceramic layer and the metal substrate. A more detailed description is as follows. The semiconductor ceramic powder used in Experiment 1 to make thermistors was in turn used to produce a slurry from which sheets could be shaped. The slurry was shaped into a ceramic green sheet using a doctor blade. This green sheet was cut into equal-sized ceramic green sheets. The metal paste used in Experiment 1 to make a metal sheet was printed on one of the ceramic green sheets by screen printing, and this ceramic green sheet was sandwiched between some of the ceramic green sheets and some others to make a flat-plate laminated block containing one layer of the metal paste. The laminated block was compressed and then fired at 950° C. for 2 hours. The obtained material was diced into test pieces (square-prismatic specimens) 40 each composed of a ceramic section 41 and another ceramic section 41 and a metal layer 42 therebetween and measuring 1.0 mm square×5.0 mm long.

Figure 5:
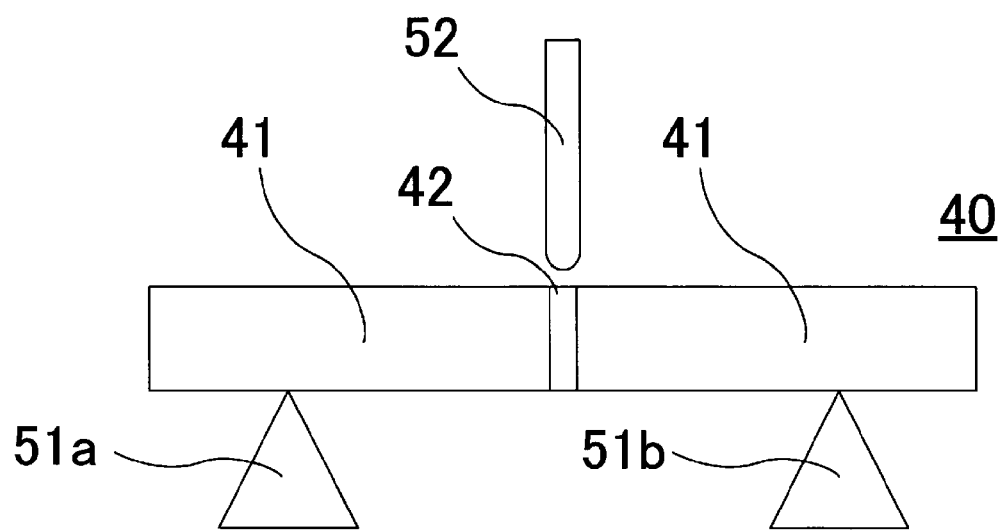
FIG. 5 illustrate a bending test conducted in Experiment 2.

The obtained test pieces 40 were subjected to a bending test using an Autograph (1) immediately after production and (2) after a 1-hour immersion in Ni plating solution followed by a 300-hour exposure to a high-temperature and high-humidity environment, 60° C. and 95%. In the bending test, as illustrated in FIG. 5, each test piece was rested on a pair of supports 51a and 51b and pressed downward with a pressing tool 52 at the metal layer 42, and the force was measured at the time when the metal layer 42 was detached from the ceramic sections 41. The measured value was taken as the strength of the bonding between the ceramic sections and the metal layer. The number of specimens was 15, and the mean was determined. Specimens with an initial bonding strength less than 170 and a bonding strength less than 40 following the exposure to high temperature and high humidity were to be rejected. Table 2 summarizes the results of the experiment.

TABLE 2

| No. | Amount of auxiliary material (vol %) | Initial bonding strength (MPa) | Bonding strength following a 300-hour exposure to 60° C. and 95 RH |
| --- | --- | --- | --- |
| 7 | 0 | 162 | 35.3 |
| 8 | 16 | 177 | 41.3 |
| 9 | 24 | 192 | 56.3 |
| 10 | 32 | 204 | 66.2 |
| 11 | 40 | 223 | 89.9 |
| 12 | 48 | 265 | 215 |

As can be seen from Table 2, both of the initial bonding strength and the bonding strength after the exposure to high temperature and high humidity were out of range for sample 7, which contained no auxiliary ceramic powder. For samples 8 to 12, both of the initial bonding strength and the bonding strength after the exposure to high temperature and high humidity were better, exceeding 170 and 40, respectively.

EXPERIMENT 3

The effect of the auxiliary material on the flexibility of the metal substrate was then evaluated. A more detailed description is as follows. Specimens for flexibility testing were prepared by stacking the ceramic green sheet obtained in Experiment 2 and the metal sheet obtained in Experiment 1, which contained the auxiliary material, and firing these sheets together. Each specimen measured 50 mm long×5 mm wide. The thickness of the metal substrate was 30 µm, and that of the semiconductor ceramic layer was 2 µm.

The obtained specimens for flexibility testing were wrapped around cylinders having a diameter of 10.13 cm, 5.07 cm, 1.30 cm, or 0.71 cm, which corresponds to the amount of warpage of the thermistor with a deflection of 1 mm, 2 mm, 8 mm, or 16 mm, respectively, and observed for any signs of fracture. The mark x denotes that wrapping the specimens for flexibility testing around the cylinder resulted in cracks developing in the metal substrate, and the mark ○ indicates that no cracks developed. The number of specimens was 5, and each sample was given a "x" if cracks were found in at least one of the five. Table 3 summarizes the results of the experiment.

TABLE 3

| No. | Amount of auxiliary material (vol %) | Diameter of the cylinder in the wrapping test (cm) | | | |
|---|---|---|---|---|---|
| | | 0.71 cm | 1.3 cm | 5.07 cm | 10.13 cm |
| 13 | 0 | ○ | ○ | ○ | ○ |
| 14 | 16 | ○ | ○ | ○ | ○ |
| 15 | 24 | ○ | ○ | ○ | ○ |
| 16 | 32 | ○ | ○ | ○ | ○ |
| 17 | 40 | X | X | ○ | ○ |
| 18 | 48 | X | X | X | X |

As can be seen from Table 3, cracks ran in the metal substrate with all deflections from 1 mm to 16 mm for sample 18, which contained 48 vol % auxiliary ceramic powder. Sample 17 achieved some degree of flexibility; cracks developed when the deflection was 8 mm or 16 mm while no cracks developed when the deflection was 1 mm or 2 mm. Samples 13 to 16 achieved sufficient flexibility; no cracks developed with any deflection from 1 mm to 16 mm.

The results of Experiments 1 to 3 indicate that adding an auxiliary ceramic powder to the metal substrate improves the strength of the bonding between the metal substrate and the semiconductor ceramic layer. The findings also show that adding the auxiliary ceramic powder to the metal substrate in an amount of about 16 vol % to about 40 vol %, both inclusive, provides the thermistor with excellent bonding strength without affecting flexibility.

EXPERIMENT 4

It was then studied how adding an auxiliary material and allowing the material to diffuse in the ceramic layer could affect the electrical properties of the thermistor. The auxiliary ceramic material was iron oxide (Fe2O3) for sample 19, the same material as that used to make the semiconductor ceramic layer (the Mn—Ni—Fe—Ti compound) for sample 20, and copper oxide (CuO) for sample 21. Each of the auxiliary materials prepared for samples 19 to 21 was then added to an Ag—Pd paste containing 90 wt % Ag and 10 wt % Pd as specified in Table 4. Each of the obtained metal pastes was applied by screen printing to both main surfaces of the ceramic green sheet prepared in Experiment 2, and the obtained laminate was compressed. The resulting sheet was degreased and then fired under the same conditions as in Experiment 1. The thermistors of samples 19 to 21 for the measurement of electrical properties were obtained in this way with overall dimensions of 2 mm×2 mm×0.5 mm and an electrode size of 2 mm×2 mm×2.0 μm. The resistance of the obtained thermistors of samples 19 to 21 was measured by the direct-current four-terminal technique in a liquid bath at 25° C. (R25) and 50° C. (R50), and the B value (R25/R50) was calculated by using the following formula.

$$B25/B50\,(K)=\ln(R25/R50)/((1/273.15+25)-1/(273.15+50))$$

The number of specimens was 10, and the mean was used. Table 4 summarizes the results of the experiment.

As can be seen from Table 4, samples 19 and 20, in which the auxiliary ceramic material was iron oxide or the same material as that used to make the semiconductor ceramic layer, were found to exhibit similar values whether about 16 vol % to about 40 vol % auxiliary material or no (0 vol %) auxiliary material was added. As for sample 21, in which the auxiliary ceramic material was CuO, it was discovered that increasing the amount of the auxiliary material to about 16 vol % and stepwise to about 40 vol % resulted in a marked decrease in B value from that achieved with no (0 vol %) auxiliary material added.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A thermistor comprising:
   a metal substrate;
   a semiconductor ceramic layer located on the metal substrate and made of material formed by a solid-phase method; and
   a pair of split electrodes on the semiconductor layer; wherein
   the metal substrate includes ceramic particles; and
   the metal substrate is not interrupted in a direction of thickness by the ceramic particles or a pillar defined by a chain of the ceramic particles.

2. The thermistor according to claim 1, wherein the metal substrate and the ceramic layer of the thermistor have a thickness of about 10 μm to about 80 μm and about 1 μm to about 10 μm, respectively.

3. The thermistor according to claim 1, wherein each of the metal substrate and the ceramic layer is in a form of a sheet.

4. The thermistor according to claim 3, wherein the sheet-shaped metal substrate and the sheet-shaped ceramic layer include stacked and fired intermediates therefor.

5. The thermistor according to claim 1, wherein the Ceramic particles constitute about 16 vol % to about 40 vol %, both inclusive, of the metal substrate.

6. The thermistor according to claim 1, wherein the semiconductor ceramic layer is made of an NTC ceramic material, and the ceramic particles are made of the same material as the semiconductor ceramic layer or an iron oxide.

7. The thermistor according to claim 1, wherein the split electrodes include ceramic particles.

8. The thermistor according to claim 1, further comprising a Ni layer and a Sn layer on each of the split electrodes.

9. The thermistor according to claim 1, further comprising a Ni layer and a Sn layer on the metal substrate.

10. The thermistor according to claim 1, further comprising a protection layer on the semiconductor ceramic layer.

11. The thermistor according to claim 1, wherein a thickness of the thermistor is about 10 μm to about 100 μm.

12. The thermistor according to claim 1, wherein the ceramic particles have a dimension of about 0.1 μm to about 3.0 μm.

TABLE 4

| No. | Auxiliary material | Amount of auxiliary material (vol %) | | | | | |
|---|---|---|---|---|---|---|---|
| | | 0 vol % | 16 vol % | 24 vol % | 32 vol % | 40 vol % | 48 vol % |
| 19 | Fe2O3 | 4078K | 4077K | 4077K | 4078K | 4085K | 4092K |
| 20 | Mn—Ni—Fe—Ti compound | 4078K | 4077K | 4078K | 4076K | 4077K | 4078K |
| 21 | CuO | 4078K | 4072K | 4062K | 4054K | 4045K | 4038K |

13. A method for producing the thermistor of claim 1 comprising:
- applying a predetermined thickness of a ceramic slurry to a carrier film to form a ceramic green sheet as an intermediate for the semiconductor ceramic layer;
- applying a predetermined thickness of a metal paste containing a ceramic powder to the ceramic green sheet to form a metal sheet as an intermediate for the metal substrate;
- applying a predetermined thickness of an electrode-forming paste to a surface of The ceramic green sheet opposite to the metal sheet to form a pattern of electrodes as an intermediate for the split electrodes; and
- firing the metal sheet, the ceramic green sheet, and the pattern of electrodes together.

14. The method according to claim 13, wherein the ceramic powder constitutes about 16 vol % to about 40 vol %, both inclusive, of the metal paste.

15. The method according to claim 13, wherein the electrode paste also contains a ceramic powder.

16. The method according to claim 13, wherein the metal substrate and the ceramic layer of the thermistor have a thickness of about 10 μm to about 80 μm and about 1 μm to about 10 μm, respectively.

17. The method according to claim 13, wherein the semiconductor ceramic layer is made of an NTC ceramic material, and the ceramic particles are made of the same material as the semiconductor ceramic layer or an iron oxide.

18. The method according to claim 13, wherein the metal substrate includes ceramic particles.

19. The method according to claim 18, wherein the metal substrate is not interrupted in a direction of thickness by the ceramic particles or a pillar defined by a chain of the ceramic particles.

20. The method according to claim 13, wherein the split electrodes include ceramic particles.

* * * * *